United States Patent [19]

Oizumi et al.

[11] 4,410,388
[45] Oct. 18, 1983

[54] PRODUCTION OF METAL CLAD LAMINATES

[75] Inventors: Masayuki Oizumi, Ohtsu; Masaharu Abe, Kobe; Yasuo Fushiki, Takatsuki, all of Japan

[73] Assignee: Kanegafuchi Kagaku Kogyo Kabushiki Kaisha, Osaka, Japan

[21] Appl. No.: 304,691

[22] Filed: Sep. 22, 1981

[30] Foreign Application Priority Data

Sep. 25, 1980 [JP] Japan .............................. 55-133814

[51] Int. Cl.³ .......................... C09J 5/02; H05K 3/00
[52] U.S. Cl. .................................. 156/307.3; 156/313; 156/323; 156/324; 428/901; 264/345
[58] Field of Search .................. 156/307.3, 309.4, 313, 156/323, 324, 64, 330; 428/901; 264/340, 345

[56] References Cited

U.S. PATENT DOCUMENTS

| 2,149,812 | 3/1939 | Lindstrom | 264/345 |
| 2,553,192 | 5/1951 | Himdall | 264/345 |
| 2,830,924 | 4/1958 | Witt | 156/278 |
| 3,352,960 | 11/1967 | McLaughlin | 264/340 |
| 3,988,408 | 10/1976 | Haining et al. | 156/253 |

FOREIGN PATENT DOCUMENTS 620463  8/1978  U.S.S.R. .............................. 264/345

Primary Examiner—Edward C. Kimlin
Assistant Examiner—F. K. Wine
Attorney, Agent, or Firm—Haight & Associates

[57] ABSTRACT

Variations in performance of metal clad reinforced resin laminates may be minimized by aging the laminates in a high-temperature, high-humidity atmosphere subsequent to the curing step. The products are useful for the production of printed circuit wiring boards.

11 Claims, 1 Drawing Figure

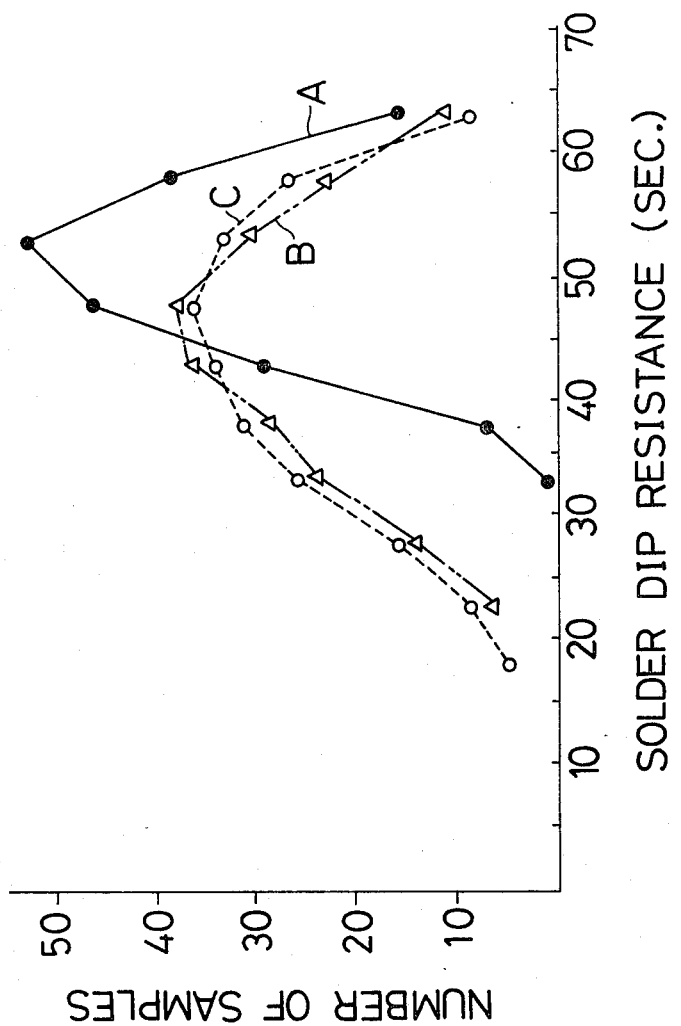

PRODUCTION OF METAL CLAD LAMINATES

BACKGROUND OF THE INVENTION

This invention relates to a process for producing metal clad reinforced resin laminates which desirably minimizes the variation in characteristics of the resultant clad laminates for use in the production of printed circuit wiring boards.

Various methods are known for producing rigid metal clad laminates. They may be classified into one of the following two types.

In the batchwise process, metal clad laminates are produced by impregnating a fibrous substrate with a resin varnish, drying the substrate to prepare a prepreg, stacking a plurality of prepregs to a desired thickness, bonding a cladding metal foil on one or both sides of the stack with adhesive coating being applied on the surface of metal foil, and finally curing the assemblage under heat and pressure in a molding press.

In the continuous mode process such as those disclosed in Japanese Unexamined Patent Publication No. 4838/1980 and Japanese Patent Application No. 1020/1980, both assigned to the same assignee as the present application, a plurality of continuous lengths of fibrous substrate are conveyed in a generally horizontal direction in parallel, impregnated with a curable liquid resin, and combined to form a unitary assemblage. A cladding metal foil is continuously applied on one or both sides of the assemblage and the resultant green clad laminate is cured by passing through a curing zone.

Experiments have shown that the performance of such metal clad laminates often varies to a relatively great extent from one to another regardless of the type of production method.

Therefore, it is a main object of the present invention to provide a process for producing metal clad laminates which may solve the abovementioned problem.

DESCRIPTION OF THE INVENTION

According to the present invention, we have found that the variation in characteristics of freshly produced metal clad laminates may be minimized by aging said laminates in an atmosphere having a high temperature and a high humidity subsequent to the curing step.

Satisfactory results have been obtained by aging freshly produced metal clad laminates at a temperature of 40° to 120° C., preferably 70° to 110° C., more preferably 90° to 105° C., at a relative humidity (RH) higher than 60%, preferably higher than 70%, more preferably higher than 75% for five to 60 minutes, occasionally 5 to 15 minutes.

The starting metal clad laminate to be subjected to the aging treatment according to the present invention may be produced by any known method. Namely, a fibrous substrate such as woven or nonwoven fabrics or paper-like sheets made of glass fiber or asbestos, natural or synthetic fibers, and papers made of cellulosic fibers such as kraft pulp or cotton linter pulp is impregnated with a curable resin and a plurality of impregnated substrates are stacked. A cladding metal foil is applied on one or both sides of the stack and the resultant assemblage is cured. The above steps may be carried out either batchwise or continuously.

Examples of curable resins which may be used for impregnating the substrate include condensation-polymerization resins such as phenol resins, urea resins and melamine resins, addition-polymerization resins such as epoxy resins, and radical polymerization resins such as unsaturated polyester resins, vinyl ester resins and diallyl phthalate resins. They may be of the thermosetting type or those which cure upon irradiation of an ionizing ray such as UV light, electron ray and gamma ray. Resins which are normally solid at room temperature are used as a resin varnish in a suitable solvent for the impregnation of substrate and then the impregnated substrate is dried to give a prepreg. Resins which are normally liquid at room temperature may be used as such and preferably have a viscosity of less than 30 poise for the impregnation of substrate.

A plurality of resin-impregnated substrates are then stacked to a desired thickness and a cladding metal foil is applied on one or both sides of the stack. Any conventional cladding metal foil may be used. Typically, an electrolytic copper foil 10 to 70 μm thick may be used. Preferably, the cladding metal foil is preliminarily given a coating of suitable adhesive on its side facing the insulating layer in the finished laminate. Phenol modified butyl rubber or an epoxy adhesive may be used for this purpose.

The resulting green laminate may be cured by a known method either by the application of heat or by irradiating an ionizing ray depending upon the nature of particular resin. When the resin is the thermosetting, condensation-polymerization type, the green laminate is cured under heat and pressure in a molding press. Resins of the addition-polymerization type or the free radical polymerization type need not be pressed during the curing step. The curing of green laminate may be continued until the laminate is substantially rigid and nontacky within a temperature range between room temperature and 150° C. and then completed before or after cutting into a suitable size.

In one preferred embodiment, a paper substrate and a liquid unsaturated polyester resin are employed. The paper substrate may be preliminarily treated with an N-methylol compound such as melamine resin or N-methylolacrylamide. All steps are carried out in continuous mode as disclosed in the above cited Japanese patent applications. A plurality of continuous lengths of paper substrate are conveyed in a generally horizontal direction in parallel, impregnated with the liquid resin, and combined to a single sheet. An electrolytic copper foil having an epoxy adhesive coating is applied on the upper side of the combined sheet and a releasable sheet such as polyester film is applied on the lower side when one side clad laminates are to be made. Then the resultant green laminate is cured in place between the copper foil and polyester film by passing through a curing zone. No or little molding pressure is applied during the curing time. The polyester film is then released. The resulting one side clad laminate is subjected to the aging treatment of this invention prior to or subsequent to cutting to a desired size. The clad laminate thus treated exhibits excellent characteristics with minimized variations.

The aging treatment of this invention is highly effective when applied to the continuous process as disclosed in the above cited Japanese patent applications. In this case, the process includes the steps of curing the green laminate, cutting into a suitable size, post-curing, aging according to this invention, and optionally correcting warp if necessary.

As is well-known, unsaturated polyester resins comprise a mixture of a condensate of saturated polycarboxylic acid such as phthalic, isophthalic, terephthalic, adipic or sebacic acid, an unsaturated acid such as maleic, fumaric or itaconic acid, and a polyol such as ethylene glycol, propylene glycol, diethylene glycol or butanediol, with a cross-linking monomer such as styrene, vinyltoluene, methyl methacrylate, diallyl phthalate or divinylbenzene. Flame retarding unsaturated polyester resins having chlorine, bromine or phosphorus atoms in the molecule of component reactants may also be used. The resin may contain conventional curing catalysts, flame-retardants, fillers and other additives.

The invention is further illustrated by the following examples in which all parts and percents are by weight.

EXAMPLE

A commercial kraft paper (MKP-150, Tomoegawa Paper Co., Ltd.) was treated with an aqueous solution of trimethylolmelamine to give a pick-up amount of 12% by weight of paper on dry basis.

Five continuous lengths of said paper were conveyed in a generally horizontal direction in parallel, impregnated with a commercial liquid polyester resin (POLY-MAL 6304, Takeda Chemical Industries, Ltd.) containing 1% of cumene hydroperoxide catalyst by pouring the liquid resin onto the upper side of the paper, and combined by passing through two metering rollers. A commercial electrolytic copper foil about 35 μm thick was applied on the upper side of the combination. The foil was preliminarily coated with an epoxy adhesive (mixture of 60 parts of EPIKOTE 828, Shell Chemical and 40 parts of TOMIDE RS 654, Fuji Kasei) on the inwardly facing side. Simultaneously, the combined structure was covered on its lower side with polyester film.

The entire assemblage was heated at 80°–130° C. for 10 minutes by passing through a tunnel oven. After releasing the polyester film, the resultant one side clad laminate of 1.6 mm thick was cut into 1,000 mm lengths, subjected to a post curing step at a temperature of 160° C. for 10 minutes, and aged in an atmosphere having a temperature of 102° C. and a relative humidity of 95%. This atmosphere was created by mixing a hot air blast and steam.

The variations in solder dip resistance among a number of samples of thusly produced laminates are shown at curve A in the accompanying drawing, which is a frequency polygon of solder dip resistance measured at a solder temperature of 260° C. according to JIS C-6481, C-96/23/60.

Curve B shows a similar frequency polygon of the same laminate but aged at a temperature of 102° C. and at a relative humidity of 30%.

Curve C is a similar frequency polygon of the same laminate when aging was not carried out at all.

As may be seen in the FIGURE of the drawing, variation in solder dip resistance of the finished products may be greatly minimized by the aging treatment of the present invention. The frequency polygon of products resulting from the present invention describes a sharp peak having a narrower band than that of unaged or insufficiently aged products. The same applies to other thermal and electrical characteristics such as peel strength, surface resistivity and warp.

The above has been offered for illustrative purposes only, and is not for the purpose of limiting the scope of this invention which is defined in the claims below.

What is claimed is:

1. In a process for producing a metal clad laminate comprising the steps of impregnating a cellulosic fiber paper substrate with a curable resin, combining a plurality of substrates thus impregnated, bonding a cladding metal foil on one or both sides of the combination, and curing the resultant green clad laminate, the improvement consisting essentially of aging the resultant cured clad laminate in an atmosphere having a temperature of 70° to 110° C. and a relative humidity of higher than 75% subsequent to said curing step to form a metal clad laminate having greatly minimized variations in solder dip resistance, peel strength, surface resistivity, and warp as compared to otherwise identical unaged or insufficiently aged laminates.

2. The process of claim 1 wherein said atmosphere has a temperature of 90° to 105° C. and a relative humidity of higher than 75%.

3. The process of claim 1 wherein said curing resin is a liquid unsaturated polyester resin.

4. The process of claim 1 wherein said cladding metal foil is an electrolytic copper foil.

5. The process of claim 4 wherein said cladding foil has a coating of epoxy adhesive on its inwardly facing side.

6. In a continuous process for producing a metal clad laminate comprising the steps of impregnating a plurality of continuous lengths of cellulosic paper fiber substrate with a liquid unsaturated polyester resin, combining said plurality of impregnated substrates to form a multilayer laminate, bonding a cladding metal foil on one side of the multilayer combination and simultaneously applying a releasable sheet on the other side, and curing the resultant green clad laminate, the improvement consisting essentially of aging the resultant cured metal clad laminate in an atmosphere having a temperature of 70° to 110° C. and a relative humidity of higher than 75% subsequent to said curing step to form a metal clad laminate having greatly minimized variations in solder dip resistance, peel strength, surface resistivity, and warp as compared to otherwise identical unaged or insufficiently aged laminates.

7. The process of claim 6 wherein said atmosphere has a temperature of 90° to 105° C. and a relative humidity of higher than 75%.

8. The process of claim 7 wherein said aging is continued for 5 to 15 minutes.

9. The process of claim 6 wherein said releasable sheet is a polyester film.

10. The process of claim 6 wherein said cladding metal foil has a coating of epoxy adhesive on its inwardly facing side.

11. The process of claim 6 wherein said paper is pretreated with an N-methylol compound such as methylolmelamine or N-methyloacrylamide.

* * * * *